(12) United States Patent  (10) Patent No.: US 7,508,663 B2
Coglitore  (45) Date of Patent: Mar. 24, 2009

(54) COMPUTER RACK COOLING SYSTEM WITH VARIABLE AIRFLOW IMPEDANCE

(75) Inventor: Giovanni Coglitore, Saratoga, CA (US)

(73) Assignee: Rackable Systems, Inc., Fremont, CA (US)

( * ) Notice: Subject to any disclaimer, the term of this patent is extended or adjusted under 35 U.S.C. 154(b) by 0 days.

(21) Appl. No.: 11/026,163

(22) Filed: Dec. 29, 2004

(65) Prior Publication Data

US 2005/0168945 A1    Aug. 4, 2005

Related U.S. Application Data

(60) Provisional application No. 60/533,380, filed on Dec. 29, 2003.

(51) Int. Cl.
H05K 7/20 (2006.01)
H05K 1/00 (2006.01)
H05K 5/00 (2006.01)
H28F 7/00 (2006.01)

(52) U.S. Cl. ..................... 361/695; 361/693; 174/252; 165/80.2; 165/122; 454/184

(58) Field of Classification Search ................ 361/694, 361/695, 721, 716, 724–727, 685; 174/252; 165/80.2–80.3, 104.33, 122; 454/184
See application file for complete search history.

(56) References Cited

U.S. PATENT DOCUMENTS

| 1,853,428 A | 4/1932 | Jackson |
| 3,184,645 A | 5/1965 | Schaeffer |
| 4,447,856 A | 5/1984 | Takahashi et al. |
| 4,644,443 A | 2/1987 | Swensen et al. |
| 4,672,509 A | 6/1987 | Speraw |
| 4,691,274 A | 9/1987 | Matouk et al. |
| 4,702,154 A | 10/1987 | Dodson |
| 4,728,160 A | 3/1988 | Mondor et al. |
| 4,774,631 A | 9/1988 | Okuyama et al. |
| 4,860,163 A | 8/1989 | Sarath |

(Continued)

FOREIGN PATENT DOCUMENTS

FR    2610471 A1    8/1988

OTHER PUBLICATIONS

Anonymous, "Cobalt RaQ 2," located at <http://www.cobalt.com/products/pdfs/datasheet.raq2.pdf>, last visited on Nov. 27, 2000, 2 pages.

(Continued)

*Primary Examiner*—Jayprakash N Gandhi
*Assistant Examiner*—Zachary M Pape
(74) *Attorney, Agent, or Firm*—Cooley Godward Kronish LLP

(57) ABSTRACT

A computer system includes a computer rack configured to support a plurality of computer chassis in a computer stack region of the computer rack; a cooling plenum configured to draw air from a back side of a computer chassis supported in the computer rack and exhaust the air through an outlet port; and an airflow control member positioned between the cooling plenum and the computer stack region and providing an impedance to airflow between the computer stack region and the cooling plenum, said airflow control member providing a greater airflow impedance to a first portion of the computer stack region than to a second portion of the computer stack region.

6 Claims, 6 Drawing Sheets

U.S. PATENT DOCUMENTS

| | | | |
|---|---|---|---|
| 4,901,200 A | 2/1990 | Mazura | |
| 5,031,075 A | 7/1991 | Casanova et al. | |
| D319,225 S | 8/1991 | Kline et al. | |
| 5,038,308 A | 8/1991 | Le et al. | |
| 5,136,464 A | 8/1992 | Ohmori | |
| 5,216,579 A | 6/1993 | Basara et al. | |
| D350,333 S | 9/1994 | Sharp | |
| 5,398,159 A | 3/1995 | Andersson et al. | |
| 5,410,448 A | 4/1995 | Barker, III et al. | |
| 5,412,534 A | 5/1995 | Cutts et al. | |
| 5,432,674 A | 7/1995 | Hardt | |
| 5,440,450 A | 8/1995 | Lau et al. | |
| 5,450,285 A | 9/1995 | Schlemmer | |
| 5,460,441 A | 10/1995 | Hastings et al. | |
| 5,466,059 A | 11/1995 | Liu | |
| 5,497,288 A | 3/1996 | Otis et al. | |
| 5,505,533 A | 4/1996 | Kammersqard et al. | |
| 5,515,239 A | 5/1996 | Kamerman et al. | |
| 5,528,454 A | 6/1996 | Niklos | |
| 5,571,256 A | 11/1996 | Good et al. | |
| 5,587,877 A | 12/1996 | Ryan et al. | |
| 5,602,721 A | 2/1997 | Slade et al. | |
| 5,646,823 A * | 7/1997 | Amori | 361/695 |
| 5,684,674 A * | 11/1997 | Yin | 361/695 |
| 5,691,883 A | 11/1997 | Nelson | |
| 5,751,549 A | 5/1998 | Eberhardt et al. | |
| 5,793,608 A | 8/1998 | Winick et al. | |
| 5,793,616 A | 8/1998 | Aubuchon et al. | |
| 5,796,580 A | 8/1998 | Komatsu et al. | |
| 5,808,871 A | 9/1998 | Rosecan et al. | |
| 5,813,243 A | 9/1998 | Johnson et al. | |
| 5,822,182 A | 10/1998 | Scholder et al. | |
| 5,896,273 A | 4/1999 | Varghese et al. | |
| 5,909,357 A | 6/1999 | Orr | |
| 5,935,227 A | 8/1999 | Phan | |
| 5,947,570 A | 9/1999 | Anderson et al. | |
| 5,956,227 A | 9/1999 | Kitaoka | |
| D415,738 S | 10/1999 | Ito et al. | |
| 5,971,506 A | 10/1999 | Dubin | |
| 6,000,464 A | 12/1999 | Scafidi et al. | |
| 6,018,456 A | 1/2000 | Young et al. | |
| 6,018,458 A | 1/2000 | Delia et al. | |
| 6,024,165 A | 2/2000 | Melane et al. | |
| 6,034,868 A | 3/2000 | Paul | |
| 6,052,276 A | 4/2000 | Do et al. | |
| 6,078,503 A | 6/2000 | Gallagher et al. | |
| 6,088,224 A | 7/2000 | Gallagher et al. | |
| 6,098,131 A | 8/2000 | Unger et al. | |
| 6,106,687 A * | 8/2000 | Edelstein | 205/98 |
| 6,114,622 A | 9/2000 | Draeger | |
| 6,134,667 A | 10/2000 | Suzuki et al. | |
| 6,141,213 A | 10/2000 | Antonuccio et al. | |
| 6,147,862 A | 11/2000 | Ho | |
| 6,185,098 B1 | 2/2001 | Benavides | |
| 6,195,262 B1 | 2/2001 | Bodette et al. | |
| 6,195,493 B1 | 2/2001 | Bridges | |
| 6,208,522 B1 | 3/2001 | Manweiler et al. | |
| 6,259,605 B1 | 7/2001 | Schmitt | |
| 6,412,292 B2 | 7/2002 | Spinazzola et al. | |
| 6,494,050 B2 | 12/2002 | Spinazzola et al. | |
| 6,496,366 B1 * | 12/2002 | Coglitore et al. | 361/687 |
| 6,504,718 B2 | 1/2003 | Wu | |
| 6,506,111 B2 | 1/2003 | Sharp et al. | |
| 6,523,918 B1 | 2/2003 | Baiza | |
| 6,525,935 B2 | 2/2003 | Casebolt | |
| 6,535,382 B2 | 3/2003 | Bishop et al. | |
| 6,557,357 B2 | 5/2003 | Spinazzola et al. | |
| D475,705 S | 6/2003 | Coglitore et al. | |
| 6,574,104 B2 | 6/2003 | Patel et al. | |
| 6,616,524 B2 | 9/2003 | Storck, Jr. et al. | |
| 6,639,794 B2 * | 10/2003 | Olarig et al. | 361/687 |
| 6,643,123 B2 * | 11/2003 | Hartel et al. | 361/678 |
| 6,667,891 B2 | 12/2003 | Coglitore et al. | |
| 2002/0075656 A1 | 6/2002 | Hastings et al. | |
| 2002/0126449 A1 | 9/2002 | Casebolt | |
| 2002/0173266 A1 * | 11/2002 | Sharp et al. | 454/184 |
| 2002/0173267 A1 | 11/2002 | Sharp et al. | |
| 2003/0035268 A1 | 2/2003 | Coglitore et al. | |
| 2004/0004813 A1 | 1/2004 | Coglitore et al. | |
| 2004/0070936 A1 | 4/2004 | Coglitore et al. | |
| 2005/0047098 A1 | 3/2005 | Garnett et al. | |
| 2005/0068716 A1 | 3/2005 | Pereira | |

OTHER PUBLICATIONS

Anonymous, "Cobalt RaQ 3," located at <http://www.cobalt.com/products/pdfs/datasheet.raq3.pdf>, last visited on Nov. 27, 2000, 2 pages.

Anonymous, "Cobalt RaQ 4," located at <http://www.cobalt.com/products/pdfs/datasheet.raq4.pdf>, last visited on Nov. 27, 2000, 2 pages.

Anonymous, "SGI—O2 Workstation Product Overview," located at <http://www.sgi.com/o2/overview.html>, last visited on Sep. 8, 2000, 4 pages.

Anonymous. (Mar. 10, 1988). "Silicon Graphics Unveils Dedicated, Entry-Level Hosting Solution," Press Release, located at <http://www.sgi.com/newsroom/press_releases/1998/march/02webserver_release.html>, last visited on Jan. 6, 2000, 2 pages.

Anonymous. "A Rack-Mountable Web Server for ISPs of All Sizes," located at http://www.sgi.com/solutions/internet/products/rackmount.html <http://www.sgi.com/solutions/internet/products/rachmoun.html>, last visited on Jan. 6, 2000, 4 pages.

Anonymous. (Monday, Apr. 24, 2000). "Rackmount Solutions," *San Jose Mercury News* Business Section, 1 page.

U.S. Appl. No. 60/270,338, filed Feb. 20, 2001, Coglitore.

U.S. Appl. No. 60/270,405, filed Feb. 20, 2001, Coglitore.

* cited by examiner

COMPUTER RACK COOLING SYSTEM WITH VARIABLE AIRFLOW IMPEDANCE

CROSS-REFERENCE TO RELATED APPLICATIONS

This draws priority from provisional patent application No. 60/533,380, filed Dec. 29, 2003, the entirety of which is incorporated by reference.

FIELD

Described is a computer system having a computer rack configured to support a plurality of computer chassis in a computer stack region of that computer rack; a cooling plenum configured to draw air from a back side of a computer chassis supported in the computer rack and exhaust the air through an outlet port; and an airflow control member positioned between the cooling plenum and the computer stack region and providing an impedance to airflow between the computer stack region and the cooling plenum. The airflow control member provides a differential airflow impedance between a first portion of the computer stack region than and a second portion of the computer stack region.

BACKGROUND

As information technology has progressed, the role of computer network centers such as server farms and server clusters has became increasingly important. The server farms can provide efficient data storage, processing, and distribution capability to support a worldwide information infrastructure. A server farm is a group or cluster of computers acting as servers and housed together in a single location. For example, a Web server farm may be either a Web site that has more than one server, or an Internet service provider that provides Web hosting services using multiple servers. In a business network, a server farm or cluster might perform such services as providing centralized access control, file access, printer sharing, and backup for workstation users.

Typically, at a site where numerous computers are connected to a network, the computers are stacked in racks and arranged in repeating rows or cells. Access to the computers may be needed for servicing, upgrading hardware, loading software, attaching cables, switching power on and off, and so forth. The elimination of as much access space as is feasible can increase the density of computer systems that may be provided for a given square footage of area at a site.

A standard rack that is widely used measures roughly 19 inches wide, 30 inches deep and 74 inches high. These racks may be arranged in rows of, for example, roughly 10-30 units, with access doors on each side of the racks. Access aisles are provided on both sides of the rows so that an operator may approach the access doors on each side. Many of the racks are filled with cumbersome computers mounted on sliders which are attached through mounting holes provided in the front and back of the rack.

In conventional rack-based computer systems, a plurality of computers are supported in a single stack in a rack. The rack may comprise a cabinet assembly having a front door and a back door. Each of the computers typically comprises a computer chassis having a motherboard and other components, such as one or more power supplies, hard drives, processors, expansion cards, contained within the chassis. The front door of the cabinet assembly provides access to the front sides of the computers and the back door provides access to the back sides, where the I/O ports for the computer are typically provided. Each computer may also include one or more fans that draw ambient air into vents provided on one side of the computer, through the computer chassis, and out of vents provided on the opposite side of the computer. The ambient air passing through the computers is used to cool the various components contained within the computer chassis.

As the number of computers in a server farm is increased, two competing factors come into play: consumption of floor space and heat management. As one increases the density of computers, problems associated with heat dissipation rises dramatically. One of the major causes of electronic component failure is overheating. High performance electronics such as CPUs generate substantial amounts of heat. Hard drives and power supplies emit substantial amounts of heat as well, thereby placing further demands on effective heat dissipation. In order for computers to continue to operate properly, appropriate heat dissipation pathways should be provided. Because each computer contains thousands of heat producing electronic parts, as the density of the computers is increased, one must also address the difficult issues of providing proper cooling mechanisms to remove heat from the individual computer nodes and the clusters as a whole. Therefore, it is desirable to provide an improved cooling system for rack-based computer systems.

SUMMARY

A computer system is described, comprising: a computer rack configured to support a plurality of computer chassis in a computer stack region of the computer rack; a cooling plenum configured to draw air from a back side of a computer chassis supported in the computer rack and exhaust the air through an outlet port; and an airflow control member positioned between the cooling plenum and the computer stack region and providing an impedance to airflow between the computer stack region and the cooling plenum, said airflow control member providing a greater airflow impedance to a first portion of the computer stack region than to a second portion of the computer stack region.

A method of operating a plurality of computers positioned in a stack in a computer rack is described, wherein each of the computers has a front side and a back side, the back sides of the computers being adjacent to a cooling air plenum. The method comprises: operating an air mover to draw air from the cooling air plenum; drawing air through the front sides of the computers; exhausting the air through the back side of the computers; and passing the air from the back side of the computers through an airflow control member to the cooling air plenum such that the airflow control member provides a plurality of different airflow impedances to the plurality of computers in the computer rack.

Another method of operating a plurality of computers positioned in a stack in a computer rack is described, wherein each of the computers has a front side and a back side, the back sides of the computers being adjacent to a cooling air plenum. The method comprises: operating an air mover to draw air from the cooling air plenum; drawing air through the front side of a first computer in a first stack region of the stack of computers; exhausting the air through the back side of the first computer; passing the air from the back side of the first computer through an airflow control member to the cooling air plenum, the airflow control member providing a first airflow impedance to the air exhausted from the back side of the first computer; drawing air through the front side of a second computer in a second stack region of the stack of computers; exhausting the air through the back side of the second computer; and passing the air from the back side of the second computer through the airflow control member to the cooling air plenum, the airflow control member providing a second airflow impedance to the air exhausted from the back side of the second computer.

Other features and aspects will become apparent from the following detailed description, particularly when taken in conjunction with the accompanying drawings. The summary is not intended to limit the scope of the description in any way.

DETAILED DESCRIPTION

In the following description, reference is made to the accompanying drawings which illustrate several variations of the described computer system. It is understood that other variations be employed and mechanical, compositional, structural, electrical, and operational changes may be made without departing from the spirit and scope of the present disclosure. The following detailed description is not to be taken in a limiting sense, and the scope of the claims is to be defined only by the terms used in the claims of the issued patent.

Figure 1:
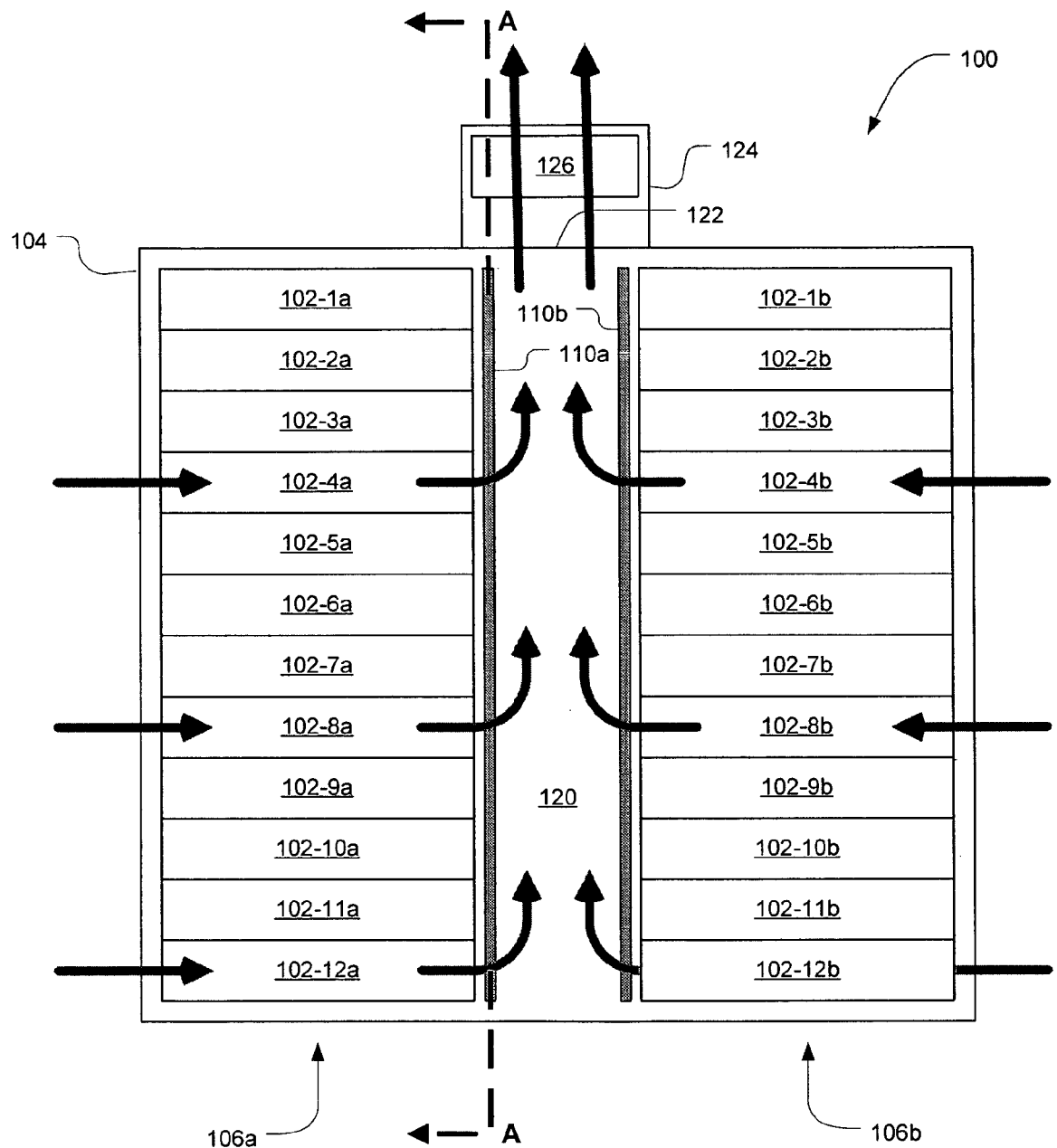
FIG. 1 is a simplified cross-sectional side view of the described computer system.

FIG. 1 shows a simplified cross-sectional side view of a computer system 100 comprising a rack assembly 104 having a plurality of computers 102 supported therein. In some variations, the rack assembly 104 may comprise a rack structure and a cabinet housing surrounding or enclosing the rack structure. As can be seen in FIG. 1, the computers 102 are supported in two stacks 106a-106b in a back-to-back arrangement such that the back sides of the computers 102 face inward and the front sides of the computers 102 face outward. The two stacks 106a-106b of computers 102 and the rack assembly 104 cooperate to form a cooling air plenum 120. The rack assembly 104 may comprise a standard-sized rack, or may have different dimensions. In one variation, the rack assembly 104 measures approximately 24" wide, 40" deep, and 74" high. A similar arrangement of computers 102 is described in U.S. Pat. No. 6,496,366, incorporated by reference herein in its entirety.

A computer may be any electronic system designed to perform computations and/or data processing. In some variations, the computer is an electronic device having a central processing unit (CPU) and memory. The CPU and memory may be provided on a main board and may be encased in a housing. Alternatively, the computer may comprise a printed circuit board (PCB) having exposed components without an enclosure.

The cooling air plenum 120 may be coupled to an exhaust port 122 located at the top of the rack assembly 104. The exhaust port 122 may be coupled to a vent hood 124 having one or more air movers 126 provided therein. Computer system 100 may be configured to draw air through the computers 102, into the cooling air plenum 120, and out of the exhaust port 122 using the airflow induced by the air movers 126. In some variations, the internal fans typically provided inside computers 102 can be omitted, since all of the cooling airflow is induced by the air movers 126 at the top of the rack assembly 104.

Computer system 100 may be configured such that the air movers 126 operate to draw air out of the cooling air plenum 120. This flow of cooling air out of the cooling air plenum 120 creates a pressure differential between the interior of the cooling air plenum 120 and the interiors of the computers 102. This causes air to be drawn from the interior of the computers 102, out of the back sides of the computers 102, and into the cooling air plenum 120. This, in turn, creates a pressure differential between the interior of the computers 102 and the air surrounding the front side of the computers 102, thereby causing the air in front of the computers 102 to flow through the vents on the front sides of the computers 102.

The arrangement can enable the air movers 126 provided at the end of the cooling air plenum 120 to create a pressure differential such that cooling air is drawn through all of the computers 102 in the computer system 100. However, in the variation illustrated in FIG. 1, since the air movers 126 are located at the top of the rack assembly 104, the air movers 126 are closest to the computers 102 located near the top of the rack assembly 104. Accordingly, the movement of air through the air movers 126 would cause a greater flow of air through the computers 102-1a, 102-1b at the top of the rack assembly 104 than through the computers 102-15a, 102-15b at the bottom. Even if very powerful air movers 126 are used, a larger proportion of the total volume of air being moved by the air movers 126 will flow through the upper computers 102 in the stacks 106a-106b. In some cases, the computers 102 at the bottom of the stacks 106a-106b will experience little or no pressure differential between the computer interiors and the cooling air plenum 126, resulting in no induced airflow through the computers 102.

To compensate for the varying distances of the computers 102 from the air movers 126, one or more airflow control members 110a-110b may be used. Each airflow control member 110 may be positioned between the computers and the air movers 126 such that the airflow control member 110 provides different airflow impedances to a plurality of computers 102. In FIG. 1, a first airflow control member 110a is positioned adjacent the back sides of the first stack 106a of computers 102-1a through 102-12a, and a second airflow control member 110b is positioned adjacent the back sides of the second stack 106b of computers 102-1b through 102-12b such that the air being drawn through the computers 102 passes through one of the airflow control members 110 before entering the cooling air plenum 120. By providing different airflow impedances to different locations along the stack 106 of computers 102, the airflow control member 110 can offset the tendency for the air mover 126 to draw cooling air predominantly from the computers 102 located near the top of the stack 106. This variable impedance can be achieved in a variety of ways.

Figure 2:
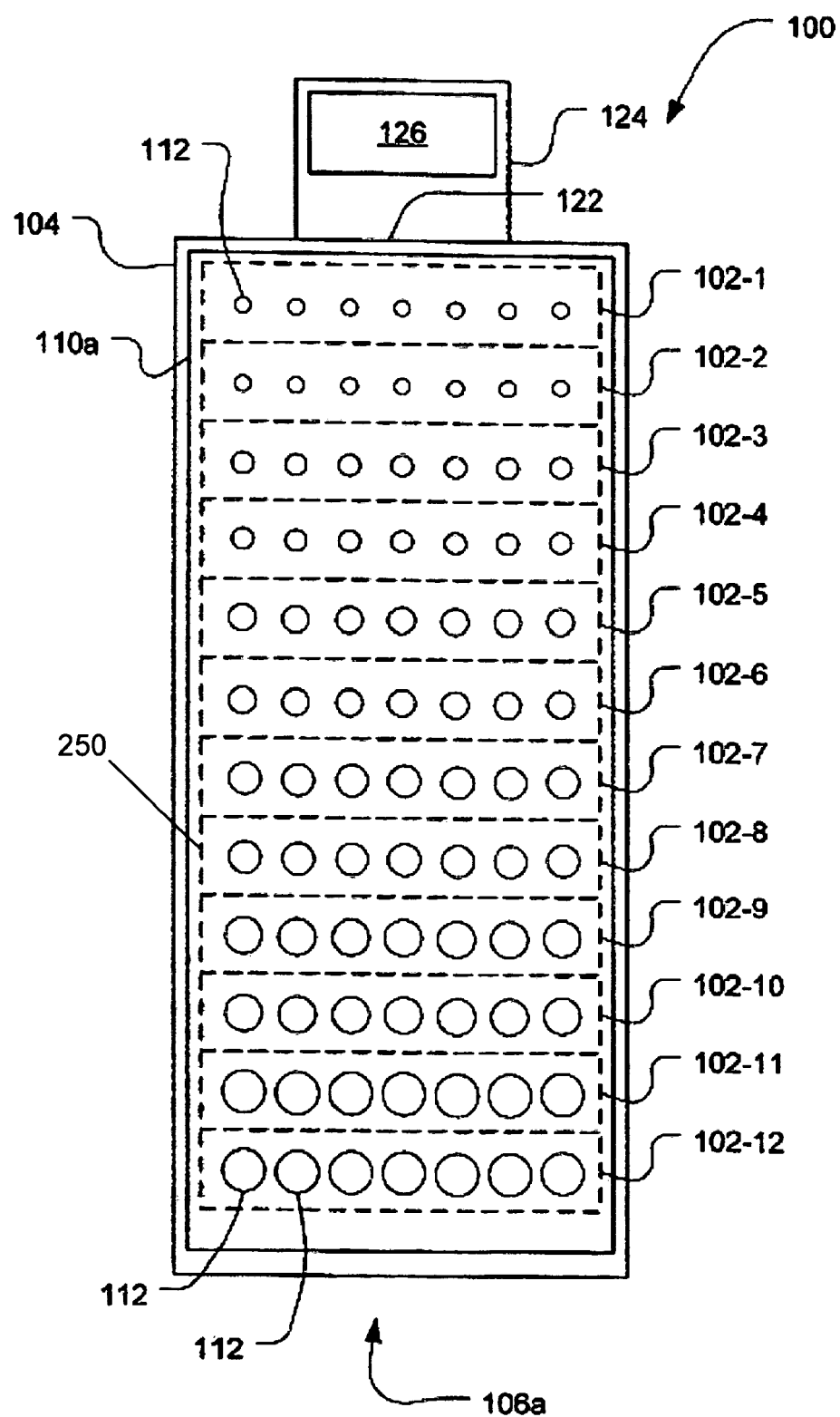
FIG. 2 is a simplified cross-sectional view of the described computer system taken along the line A-A shown in FIG. 1.

FIG. 2 is a cross-sectional view of the computer system 100 taken along the line A-A shown in FIG. 1. In this variation, the airflow control member 110a comprises a solid plate extending substantially from the top computer 102-1 to the bottom computer 102-12 in the first stack 106a. The airflow control member 110a also comprises a plurality of apertures 112 formed in the solid plate. These apertures 112 may be positioned to align with the vents on the back sides of the computers 102 so that air emitted from the computers 102 may pass through the apertures 112 to the cooling air plenum 120.

In order to provide the variable impedance, the apertures 112 closer to the one or more air movers 126 have a smaller cross-sectional area than the apertures 112 further from the air movers 126. As can be seen in FIG. 2, the apertures 112 adjacent computers 102-1, 102-2 are very small, thereby providing a large airflow impedance, and the apertures 112 adjacent computers 102-11, 102-12 are very large, thereby producing an smaller airflow impedance. Thus, even though the pressure differential between the interior of the computers 102-1 and 102-2 and the cooling air plenum 120 is greater than the pressure differential between the interior of the computers 102-11 and 102-12 and the cooling air plenum 120, the difference in size of the apertures 120 adjacent these computers 102 may produce a similar overall airflow rate through each of the computers 102. The apertures 112 positioned adjacent the remaining computers 102-3 through 102-10 increase in size with distance from the air movers 126.

Figure 3:
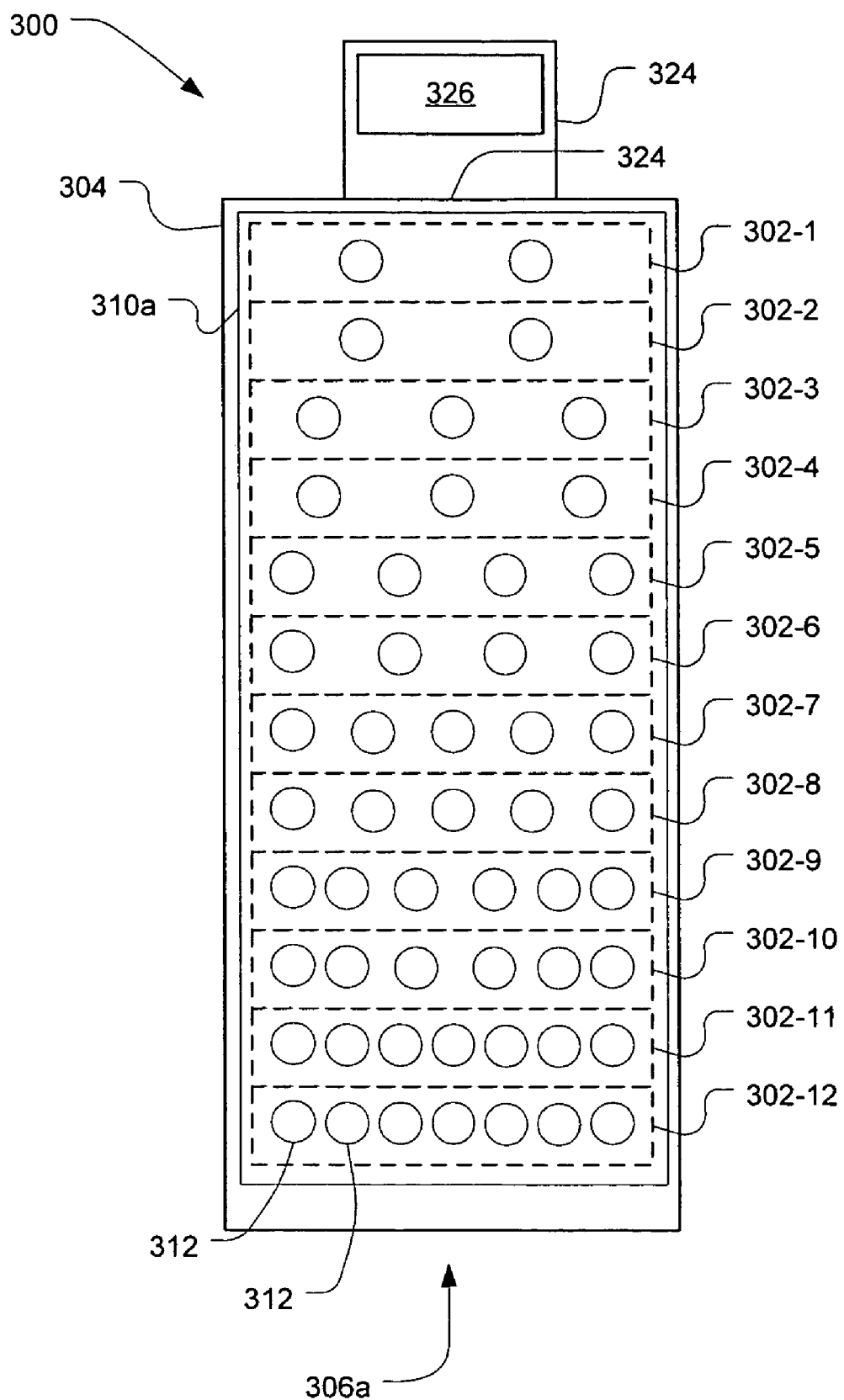
FIG. 3 is a simplified cross-sectional view of the described computer system.

In the variation illustrated in FIG. 2, the number of apertures 112 adjacent each computer 102 is the same over the length of the stack 106a, but the size of the apertures 112 gradually increases with distance away from the air mover 126. In the variation illustrated in FIG. 3, the size of the apertures 312 are constant, but the number and/or spacing of the apertures 312 may vary over the length of the airflow control member 310. In yet other variations, a combination of varying aperture size, quantity, and spacing may be used to achieve the variable airflow impedance. It may be desired to form the apertures 112 near the bottom of the stack 106a larger than the vents in the back of computers 102-11, 102-12, thereby creating no increased airflow impedance. In yet other variations, one or more computers 102 at the bottom of the stack 106 may not be covered by the airflow control member 110. Accordingly, no additional airflow impedance is applied to these computers.

When using the airflow control members, it may be desirable in some variations to provide an airflow direction system for each individual computer in order to ensure that all of the heat-generating components in the computers receive a sufficient amount of cooling airflow. This airflow direction system may comprise passive direction devices, such as fins or panels to direct the cooling air evenly across the width of the computer, or may comprise active direction devices, such as fans to redirect the flow of air. In other variations, airflow direction systems may be formed in the airflow control member.

The airflow control member may also improve cooling performance when one or more computers 102 are removed from the stack 106a, leaving an empty shelf in the rack assembly 104. In FIG. 1, the rack assembly 104 is shown with all of the available shelf slots filled with computers 102. If one of the computers 102 were removed, then the overall airflow impedance for that one location may be substantially reduced. This may cause the cooling air to be disproportionally drawn by the air movers 126 through that empty location, resulting in a decrease in cooling airflow for the other computers 102 in the computer system 100. The use of the airflow control member 110 reduces the volume of cooling air that would normally be drawn through that empty location by providing an airflow impedance, thereby resulting in increased airflow through the remaining computers 102. This can provide a more balanced cooling airflow, regardless of the number of open slots in the rack assembly 104. This balanced cooling can be even more effective where the impedance caused by the airflow control member 110 is significantly greater than the internal impedance of the individual computers 102.

Figure 4A:
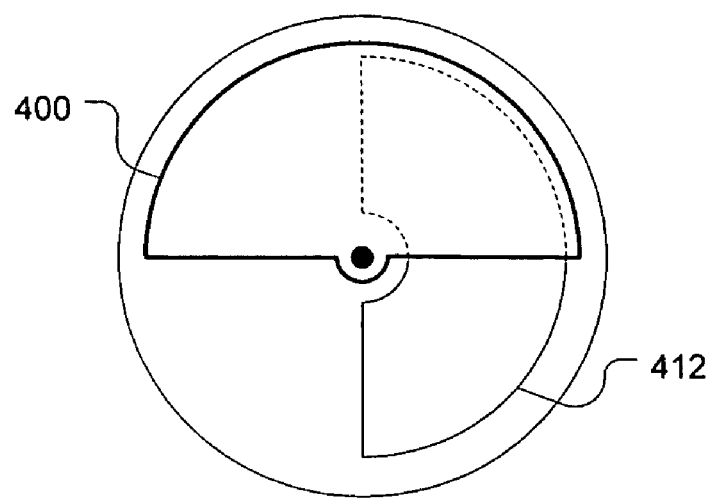
FIGS. 4A-4C show an adjustable damper as placed in the described computer system.
Figure 4B:
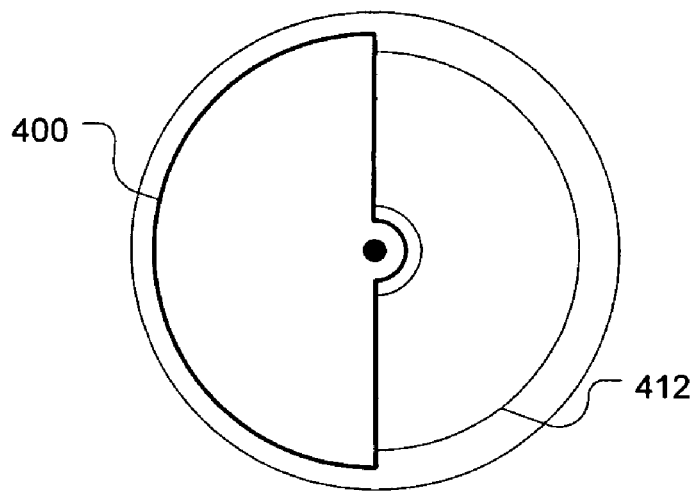
Figure 4C:
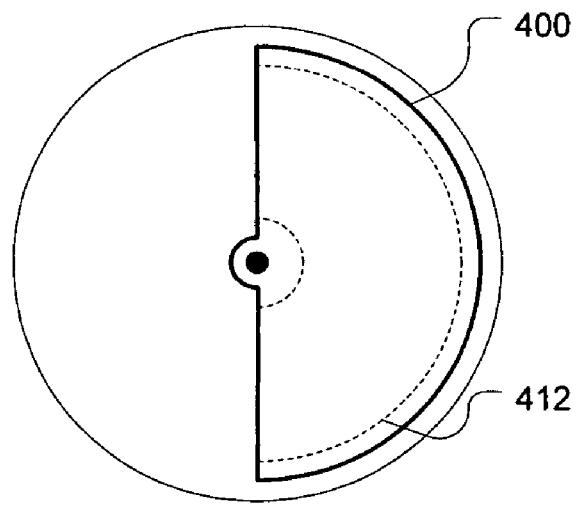

The airflow control member may be configured to accomplish an adjustable airflow impedance. This adjustability may be achieved, for example, through the use of adjustable dampers. FIGS. 4A-4C show an adjustable damper. The damper may comprise a shield 400 which can be rotated to cover part or all of the aperture 412. In FIG. 4A the shield 400 is positioned such that half of the aperture 412 is exposed. FIG. 4B shows the aperture 412 fully open, and FIG. 4C shows the aperture 412 fully closed. In other variations, the adjustable dampers may comprise slidable covers which may be adjusted to cover varying amounts of the apertures in the airflow control member.

The use of adjustable dampers can enable the airflow control member to be customized, or "tuned," to provide the optimal airflow impedance for varying computer configurations. For example, some computers may have internal components that are densely packed or arranged in such a way that the internal impedance of the computer on the cooling airflow passing through the computer is very high. In other computers, the internal components may be more loosely packed, thereby resulting in a lower internal impedance. It may be desired to use the same rack assembly and airflow control member with different types of computers for future computer system designs, in order to decrease manufacturing costs. The adjustable dampers may be modified, depending on the desired configuration of computers.

In addition, over time, individual computers mounted in the rack assembly 104 may be replaced with computers having different internal impedances. When this is done, the damper for the replaced computer may be adjusted to compensate for differences in the new computer's impedance. This can also be beneficial when a customer purchases a computer system 100 only partially full with computers 102, leaving one or more empty slots available. The dampers corresponding to these available slots may be completely closed in order to direct all of the cooling air through the installed computers 102. Over time, as additional computers 102 are added to the system 100, the corresponding dampers can be opened to the desired size. In yet other variations, it may be desirable to adjust the sizes of the dampers corresponding to a single computer such that certain portions of that computer receive a greater amount of cooling air than other portions.

In some variations, the dampers may be individually manually adjustable. This can decrease the complexity of the airflow control member, thereby reducing costs. In other variations, two or more dampers may be coupled such that a single manual adjustment will open or close the dampers in unison. For example, it may be useful for all of the dampers that correspond to a single computer or a plurality of adjacent computers to be collectively adjustable with a single action.

In yet other variations, it may be desirable to provide motors, gears, pulleys, or other actuation components to mechanically adjust the damper size. This adjustment could be in response to commands issued by a computer operator, or may be automatically controlled by a climate control system which monitors the cooling of the various components in the computer system 100 and/or the airflow through the various components, and adjusts the dampers to obtain the desired cooling.

Referring back to FIG. 2, in some variations it may be desirable to provide seals 250 between the various components in the computer system 100 in order to ensure that all of the airflow drawn out of the exhaust port 122 by the air movers 126 is drawn through the computers 102, thereby maximizing the efficiency of air movers 126 to cool the system 100. In other variations, a perfect seal in the cooling air plenum 120 need not be achieved. It may be determined that the amount of airflow leakage is sufficiently small relative to the amount of airflow passing through the computers 102 to be negligible.

In variations where gaskets and seals are used, the back-to-back nature of the computers may be advantageous because the cooling air plenum 120 is provided in the interior portion of the rack assembly 104. In a back-to-back computer system, the computers 102 may be configured such that the I/O ports and other components that are typically accessed while the computers 102 are in operation are provided on the front sides of the computers 102. Therefore, the back sides of the computers 102 need not be accessed, except in limited situations, such as when the computers 102 are powered down and/or removed from the rack assembly 104. Because the back sides need not be accessed by the user, the sealing assembly may be simplified.

Figure 5:
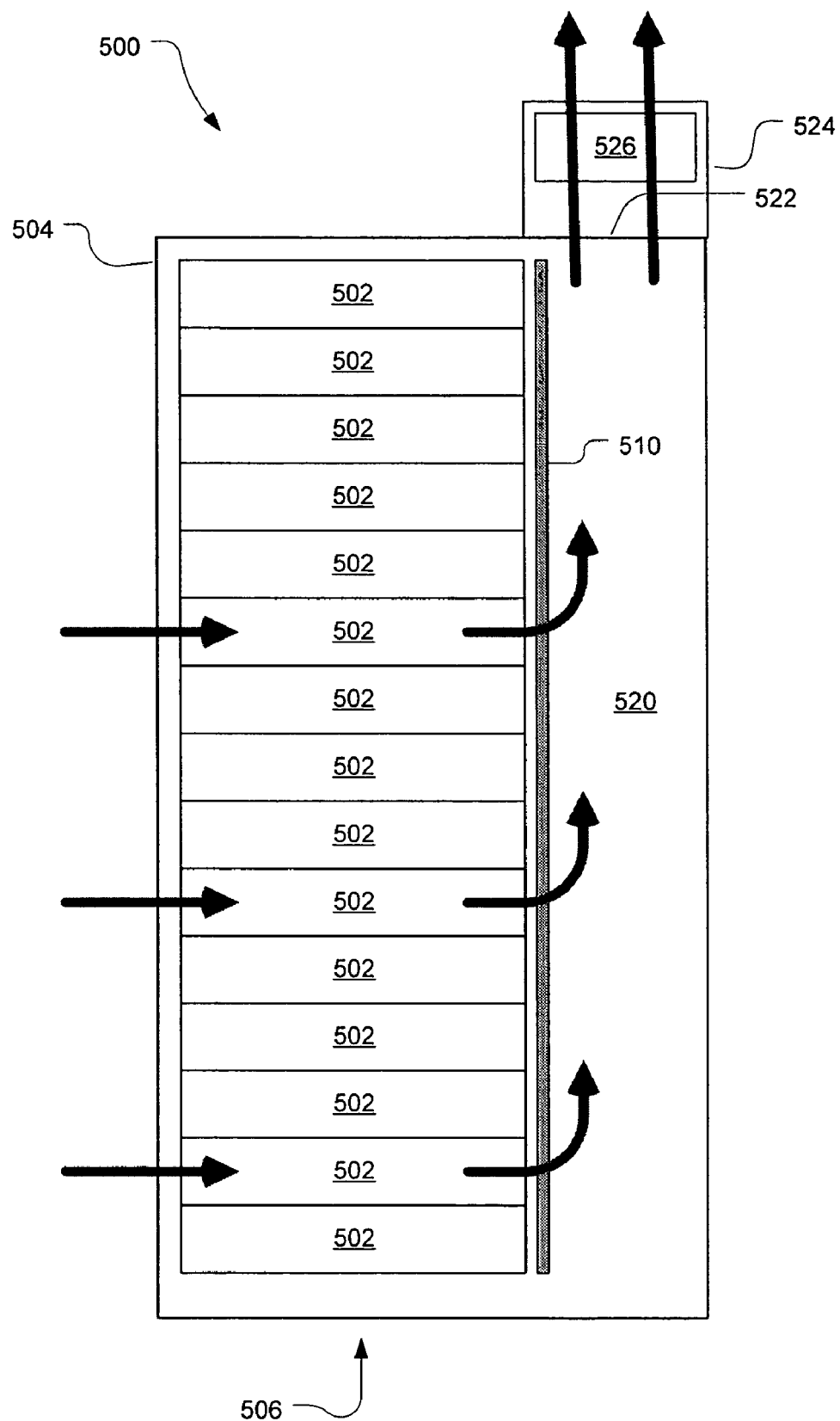
FIG. 5 shows a simplified block diagram of a computer system having a single stack of computers.
Figure 6:
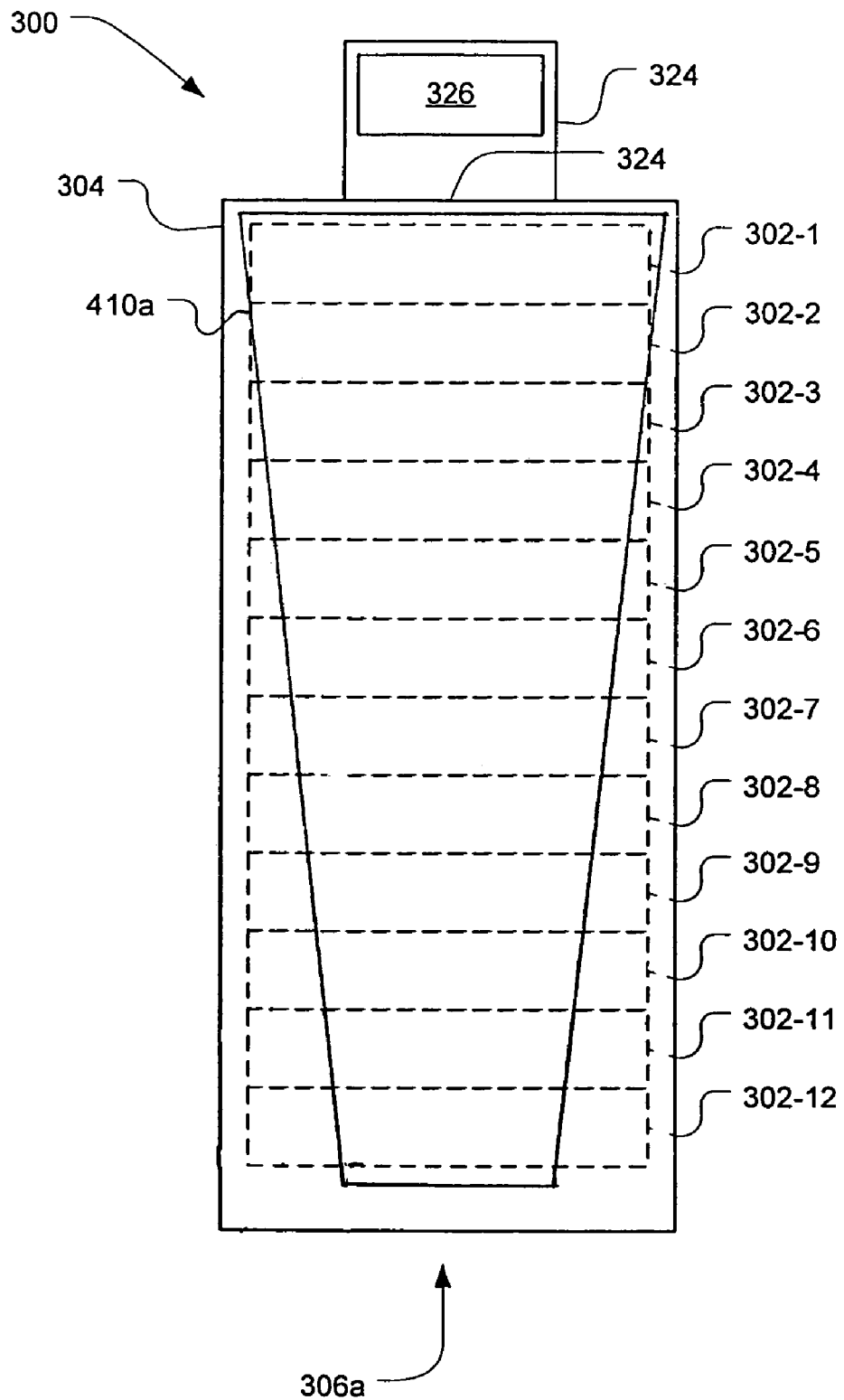
FIG. 6 is a simplified cross-sectional view of the described computer system showing an airflow control member 410a comprising a plate having a first width adjacent a first portion of a computer stack region and a second width smaller than the first width adjacent a second portion of the computer stack region.

While the above-mentioned variations refer to a computer system having two stacks of computers arranged in a back-to-back configuration, other variations are also acceptable. For example, FIG. 5 shows a simplified block diagram of a computer system 500 having a single stack 506 of computers 502. As in the computer system 100 shown in FIG. 1, one or more air movers 526 are provided to draw air out of a cooling air plenum 520. This creates a pressure differential, which draws air into the front sides of the computers 502, through the computers 502, and out of the back sides. An airflow control member 510 is provided adjacent the back sides of the computers 502 to provide a variable impedance to the airflow being drawn out of the computers 502, as described above with respect to FIGS. 1-3.

Another variation of the described system a cooling system having an airflow control member configured to eliminate the need for primary fans within each of the individual computers mounted in the computer system. The pressure differential in the cooling air plenum 120 created by the air movers 126 and evenly distributed by the airflow control member 110 may provide sufficient airflow through each of the computers 102 in the computer system 100 to eliminate the need for additional fans to force air through each of the computer chassis.

In a typical computer, one or more primary fans are positioned adjacent the vents along one of the sides of the computer. These fans are used either to draw air out of the interior of the computer and expel the air out of the side, or to draw ambient air into the interior of the computer. Typically, these fans are provided along the back sides of the computers to create an airflow into the front of the computers and out of the backs of the computers.

The air mover 126 located at the end of the cooling air plenum 120 may be provided with the capacity to move a volume of air sufficient to cool all of the computers 102 in the system 100, without the aid of additional fans contained in the individual computers 102. The airflow control member 110 provides a variable impedance to distribute the airflow across all of the computers 102.

Some computers may include dedicated fans for cooling particular components of the computer, such as, for example, CPU fans and power supply fans. These dedicated component fans are used to create a flow of air across a single component, but do not have a significant affect on the flow of air into, through, and out of the computer. This function is typically performed by the primary fans in the computer. However, when at least some of these primary fans are omitted, the dedicated component fans may be used in conjunction with the central air mover and the airflow control member to cool the computers.

The system has been described in terms of examples and illustrative figures, those of ordinary skill in the art will recognize that the broadly described system is not limited to the embodiments, variations, or figures described. For example, many of the descriptions discussed above refer to the computer systems being utilized as part of a server farm. At other instances, the computer systems may be used for other purposes, such as, for example, storage arrays. The multiple computers in a single stack may be identical or may be different. In some variations, the computers in a stack may have different form factors (e.g., some computers have a 1U profile, while others have a 2U or 3U profile) and may be configured to perform different tasks (e.g., one or more computers may be configured as a central controllers, while other computers in the stack may be configured as storage arrays).

In addition, although some of the described devices are referred to as computer systems that are fully or partially populated with computers, it is to be understood that different types of components may be mounted in one or more of the available shelf locations in the rack assembly. For example, one or more of the locations may be populated by dedicated power supplies, routers, switches, keyboards, or other electronic components. These components may or may not be configured to utilize a flow of cooling air during operation.

The examples described above show the exhaust port and the one or more air movers being positioned at the top of the rack assembly. These openings and movers may be positioned elsewhere in the system. For example, the exhaust port and air movers may be positioned at the bottom of the cooling air plenum to draw the air from the back sides of the computers down to the bottom of the rack assembly. Ductwork may be provided under the floor supporting the computer system to channel the exhaust air away.

The exhaust ports and air movers may be situated at both the top and the bottom of the cooling air plenum to draw air in both directions. In this case, the air mover at the top of the rack assembly might be configured to draw air predominantly from the computers in the top half of the rack assembly, and the air mover on the bottom configured to draw air predominantly from the computers in the bottom half. It may be desirable for the airflow control member to provide the highest airflow impedance at both the top and bottom ends of the cooling air plenum and the lowest airflow impedance near the middle of the plenum.

The figures provided are merely representational and may not be drawn to scale. Certain proportions thereof may be exaggerated, while others may be minimized. FIGS. 1-5 are intended to illustrate in and participate in the described devices and methods in such a way as is understood by and appropriately carried out by those of ordinary skill in the art.

The description is not intended to be exhaustive nor is it intended to limit the claimed devices and methods to the precise form disclosed.

I claim:

1. A computer system, comprising:
  a computer rack configured to support a plurality of computer chassis in a computer stack region of the computer rack;
  a cooling plenum configured to draw air from a back side of a computer chassis supported in the computer rack and exhaust the air through an outlet port; and
  an airflow control member mounted to the computer rack and positioned between the cooling plenum and the computer stack region and providing an impedance to airflow between the computer stack region and the cooling plenum, the airflow control member providing a greater airflow impedance to a first portion of the computer stack region than to a second portion of the computer stack region;

wherein the airflow control member comprises a plate having a plurality of apertures formed therein, the sizes of the apertures increasing with distance from the outlet port, wherein the rates of the airflow through apertures at each distance from the outlet port are configurable to be similar;

wherein the airflow control member comprises a plurality of adjustable dampers, each of the plurality of apertures being associated with one of the plurality of adjustable dampers;

wherein each of the plurality of adjustable dampers includes a substantially semi-circular shield that is rotatable to full open, to cover a portion of, and to fully close one of the plurality of apertures; and wherein each of the plurality of adjustable dampers is independently adjustable.

2. The computer system of claim 1, wherein:

the first portion of the computer stack region is closer to the outlet port than the second portion of the computer stack region.

3. The computer system of claim 1, further comprising:

a fan provided in the outlet port to draw air from the cooling plenum out of the outlet port.

4. A computer system, comprising:

a computer rack configured to support a plurality of computer chassis in a computer stack region, the computer stack region comprising a first portion configured to support a first computer chassis and a second portion configured to support a second computer chassis, the first portion closer than the second portion to an air outlet port; and one or more plates mounted to the computer rack and positioned adjacent the computer stack region, the one or more plates comprising a plurality of apertures, the plurality of apertures including a first set of one or more apertures positioned adjacent the first portion of the computer stack region and a second set of one or more apertures positioned adjacent the second portion of the computer stack region, the second set of apertures having a larger total aperture area than the first set of apertures;

wherein air flowing from the computer stack region to the outlet port passes through the plurality of apertures;

wherein the sizes of the apertures increase with distance from the outlet port, wherein the rates of the air flowing through apertures at each distance from the outlet port are configurable to be similar;

wherein the airflow control member comprises a plurality of adjustable dampers, each of the plurality of apertures being associated with one of the plurality of adjustable dampers;

wherein each of the plurality of adjustable dampers includes a substantially semi-circular shield that is rotatable to fully open, to cover a portion of, and to fully close one of the plurality of apertures; and wherein each of the plurality of adjustable dampers is independently adjustable.

5. The computer system of claim 4, further comprising a first computer chassis supported in the first position of the computer stack region and a second computer chassis supported in the second portion of the computer stack region.

6. The computer system of claim 4, further comprising seals adapted to interface the one or more plates with computer chassis in the computer stack region.

* * * * *